(12) United States Patent
Sakui et al.

(10) Patent No.: US 12,740,044 B2
(45) Date of Patent: Sep. 15, 2026

(54) MEMORY DEVICE INCLUDING SEMICONDUCTOR ELEMENT

(71) Applicant: Unisantis Electronics Singapore Pte. Ltd., Singapore (SG)

(72) Inventors: Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 105 days.

(21) Appl. No.: 18/922,784

(22) Filed: Oct. 22, 2024

(65) Prior Publication Data

US 2025/0133717 A1 Apr. 24, 2025

(30) Foreign Application Priority Data

Oct. 24, 2023 (WO) .................. PCT/JP2023/038291

(51) Int. Cl.
*G11C 11/404* (2006.01)
*G11C 11/4096* (2006.01)
*H10B 12/00* (2023.01)

(52) U.S. Cl.
CPC ............ *H10B 12/20* (2023.02); *G11C 11/404* (2013.01); *G11C 11/4096* (2013.01)

(58) Field of Classification Search
CPC .... G11C 11/404; G11C 11/4096; H10B 12/20
See application file for complete search history.

(56) References Cited

U.S. PATENT DOCUMENTS

2003/0111681 A1 6/2003 Kawanaka
2006/0157738 A1 7/2006 Kawanaka
2008/0137394 A1 6/2008 Shimano et al.
(Continued)

FOREIGN PATENT DOCUMENTS

JP H 02-188966 A 7/1990
JP 03-171768 A 7/1991
(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: "Impact of Surrounding Gate Transistor (SGT) for Ultra-High-Densitiy LSI's" IEEE Transaction on Electron Devices, vol. 38, No. 3, pp. 573-578 (1991) (6 pages).

(Continued)

*Primary Examiner* — Yong J Choe
(74) *Attorney, Agent, or Firm* — Crowell & Moring LLP

(57) ABSTRACT

A plurality of dynamic flash memory cells are arranged in a matrix on a substrate, a first dynamic flash memory cell and a second dynamic flash memory cell overlap each other in a vertical direction or horizontal direction of a substrate, and voltages applied to a select gate line common to the memory cells, a plate line, a first bit line and a second bit line that are independent, and a source line are controlled to perform a data erase operation of the first and second dynamic flash memory cells, an independent data write operation or data write prohibition operation of the first and second dynamic flash memory cells, and a data read operation of the first and second dynamic flash memory cells.

15 Claims, 10 Drawing Sheets

(56) References Cited

U.S. PATENT DOCUMENTS

| | | | | |
|---|---|---|---|---|
| 2020/0135863 | A1 | 4/2020 | Han et al. | |
| 2022/0310608 | A1* | 9/2022 | Harada | H10B 12/20 |
| 2022/0328488 | A1* | 10/2022 | Sakui | G11C 11/404 |
| 2022/0367473 | A1 | 11/2022 | Sakui et al. | |
| 2022/0367681 | A1 | 11/2022 | Harada et al. | |
| 2023/0106561 | A1 | 4/2023 | Hsu | |
| 2023/0186966 | A1 | 6/2023 | Shirota et al. | |
| 2023/0284432 | A1 | 9/2023 | Harada et al. | |

FOREIGN PATENT DOCUMENTS

| | | | |
|---|---|---|---|
| JP | 2003-188279 | A | 7/2003 |
| JP | 2008-147514 | | 6/2008 |
| JP | 7057032 | B1 | 4/2022 |
| WO | WO 2022/239237 | A1 | 11/2022 |
| WO | WO 2023/112122 | A1 | 6/2023 |
| WO | WO 2023/166608 | A1 | 9/2023 |

OTHER PUBLICATIONS

H. Chung, H. Kim, H. Kim, K. Kim, S. Kim, K. W.Song, J. Kim, Y.C. Oh, Y. Hwang, H. Hong, G. Jin, and C. Chung: "Novel 4F2 DRAM Cell with Vertical Pillar Transistor(VPT)," 2011 Proceeding of the European Solid-State Device Research Conference, (2011) (4 pages).

H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No. 12, December, pp. 2201-2227 (2010) (27 pages).

K. Tsunoda, K .Kinoshita, H. Noshiro, Y. Yamazaki, T. Iizuka, Y. Ito, A. Takahashi, A. Okano, Y. Sato, T. Fukano, M. Aoki, and Y. Sugiyama : "Low Power and high Speed Switching of Ti-doped NiO ReRAM under the Unipolar Voltage Source of less than 3V," IEDM (2007) (4 pages).

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015) (9 pages).

M. G. Ertosun, K. Lim, C. Park, J. Oh, P. Kirsch, and K. C. Saraswat : "Novel Capacitorless Single-Transistor Charge-Trap DRAM (1T CT DRAM) Utilizing Electrons," IEEE Electron Device Letter, vol. 31, No. 5, pp. 405-407 (2010) (3 pages).

J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012) (3 pages).

T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32nm Node and Beyond," IEEE IEDM (2006) (4 pages).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697,Apr. 2006. (6 pages).

F. Morishita, H. Noda, I. Hayashi, T. Gyohten, M. Oksmoto, T. Ipposhi, S. Maegawa, K. Dosaka, and K. Arimoto: "A Capacitorless Twin-Transistor Random Access Memory (TTRAM) on SOI," IEICE Trans. Electron., vol. E90-c., No. 4 pp. 765-771 (2007) (7 pages).

K. Sakui, N. Harada,"Dynamic Flash Memory with Dual Gate Surrounding Gate Transistor (SGT)," Proc. IEEE IMW, pp. 72-75 (2021) (2 pages).

T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002) (13 pages).

K. Sakui, Y. Li, M. Kakumu, K. Kanazawa, I. Kunishima, Y. Iwata, and N. Harada, "Design Impact on Three Gate Dynamic Flash Memory (3G_DFM) for Long Hole Retention Time and Robust Disturbance Shield," Memories—Materials, Devices, Circuits and Systems, Elsevier, 4, 100054, pp. 1-5, May 2023 (5 pages).

W.-C. Chen, H.-T. Lue, M.-Y. Wu, T.-H. Yeh, P.-Y. Du, T.-H. Hsu, C.-C. Hsieh, K.-C. Wang, and C.-Y. Lu, "A 3D Stackable DRAM: Capacitor-less Three-Wordline Gate-Controlled Thyristor (GCT) RAM with >40μA Current Sensing Window, >1010 Endurance, and 3-second Retention at Room Temperature," in IEEE IEDM (International Electron Devices Meeting), pp. 607-610, Dec. 2022. (4 pages).

W.-C. Chen, H.-T. Lue, T.-H. Hsu, K.-C. Wang, and C.-Y. Lu, "A Simulation Study of Scaling Capability toward 10nm for the 3D Stackable Gate-Controlled Thyristor (GCT) DRAM Device," in IEEE IMW (International Memory Workshop), pp. 25-28, May 2023 (4 pages).

M. Huang, S. Si, Z. He, Y. Zhou, S. Li, H. Wang, J. Liu, D. Xie, M. Yang, K. You, C. Choi, Y. Tang, X. Li, S. Qian, X. Yang, L. Hou, W. Bai, Z. Liu, Y. Tang, Q. Wu, Y. Wang, T. Dou, J. Kim, G.-L. Wang, J. Bai, A. Takao, C. Zhao, A. Yoo, M. Zhou, "A 3D Stackable 1T1C DRAM: Architecture, Process Integration and Circuit Simulation," in IEEE IMW (International Memory Workshop), pp. 29-32, May 2023 (4 pages).

J.W. Han, S.H. Park, M.Y. Jeong, K.S. Lee, K.N. Kim, H.J. Kim, J.C. Shin, S.M. Park, S.H. Shin, S.W. Park, KS. Lee, J.H. Lee, SH. Kim, B.C Kim, M.H. Jung, I.Y. Yoon, H. Kim, S.U. Jang, K.J. Park, Y.K. Kim, I.G. Kim, J.H Oh, S.Y. Han, B.S. Kim, B.J. Kuh, and J.M. Park, "Ongoing Evolution of DRAM Scaling via Third Dimension-Vertically Stacked DRAM" in 2023 Symposium on VLSI Technology and Circuits Digest of Technical Papers, TFS1-1, pp. 1-2, Jun. 2023 (2 pages).

K. Sakui, and N. Harada, "Read Non-Destructive Dynamic Flash Memory (DFM) with Dual and Double Gates," Extended Abstracts of the 2022 International Conference on Solid State Devices and Materials, pp. 405-406, Sep. 2022 (2 pages).

International Search Report and Written Opinion in International Application No. PCT/JP2023/038291 (in Japanese) completed on Dec. 28, 2023 (10 pages).

* cited by examiner 19a (BLa)
19b (BLb)
19c (BLc)
19d (BLd)
17b (SH3)
17a (SG2)
11 (SL)
2F 241
221
181
270 (SG2)
260 (PL)
250 (SG1)
231
293 (SL1)
291 (BL1)
292 (SL0)
290 (BL0)
180
240
220
230
10

BL0 BL1
SH32 SH22 SH12
Cell3
SL3
SG21 PL1 SG11
Cell2
SL2
SH31 SH21 SH11
Cell1
SL1
SG20 PL0 SG10
Cell0
SL0
SH30 SH20 SH10

MEMORY DEVICE INCLUDING SEMICONDUCTOR ELEMENT

INCORPORATION BY REFERENCE

This application claims priority to PCT/JP2023/038291, filed Oct. 24, 2023, the entire content of which is incorporated herein by reference.

BACKGROUND OF THE INVENTION

Field of the Invention

The present invention relates to a memory device including a semiconductor element.

Description of the Related Art

Increase of integration density and performance of a memory element has been requested in recent development of large scale integration (LSI) technologies.

Increase in density and performance of a memory element has been advanced. Examples of such memory elements include a dynamic random access memory (DRAM; refer to H. Chung, H. Kim, H. Kim, K. Kim, S. Kim, K. W. Song, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011), for example) in which capacitors are connected by using a surrounding gate transistor (SGT; refer to Japanese Patent Laid-open No. H02-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)) as a select transistor, a phase change memory (PCM; refer to H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No 12, December, pp. 2201-2227 (2010), for example) in which variable resistance elements are connected, a resistive random access memory (RRAM; refer to K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V", IEDM (2007), for example), and a magneto-resistive random access memory (MRAM; refer to W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015), for example) in which the orientation of magnetic spin is changed by current to change resistance.

There are also DRAM memory cells (refer to Japanese Patent Laid-open No. H03-171768, M. G. Ertosun, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, Vol. 31, No. 5, pp. 405-407 (2010), J. Wan, L. Rojer, A. Zaslavsky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida: "A Capacitorless 1T-DRAM Technology Using Gate-Induced Drain-Leakage (GIDL) Current for Low-Power and High-Speed Embedded Memory," IEEE IEDM (2006)) constituted by one MOS transistor without capacitors. In a DRAM memory cell constituted by one MOS transistor, for example, among holes and electrons generated in a channel through an impact ionization phenomenon with source-drain current of a N-channel MOS transistor, some or all of the holes are held in the channel to write logical storage data "1". Then, the holes are removed from the channel to write logical storage data "0". In a memory cell, "1" writing memory cells and "0" writing memory cells randomly exist for a common select word line. When on-voltage is applied to the select word line, voltage of a floating-body channel of any selected memory cell connected to the select word line largely varies due to capacitive coupling between the gate electrode and the channel. The memory cell is required to improve operation margin decrease due to variation in the floating-body channel voltage and improve data retention characteristic decrease due to removal of some of holes as signal electric charge accumulated in the channel.

There are twin-transistor MOS transistor memory elements in which one memory cell is formed in an SOI layer by using two MOS transistors (refer to, for example, US2008/0137394 A1, US2003/0111681 A1, and F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI", IEICE Trans. Electron., Vol. E90-c., No. 4 pp. 765-771 (2007)). In these elements, an N+ layer that divides the floating-body channels of the two MOS transistors and functions as a source or a drain is formed in contact with an insulating layer on a substrate side. The N+ layer electrically separates the floating-body channels of the two MOS transistors. Holes as signal electric charge are accumulated only in the floating-body channel of one of the MOS transistors. The other MOS transistor serves as a switch for reading the signal holes accumulated in the one MOS transistor. Since holes as signal electric charge are accumulated in the channel of one MOS transistor in this memory cell as well, the memory cell is required to improve operation margin decrease or improve data retention characteristic decrease due to removal of some of holes as signal electric charge accumulated in the channel, similarly to the above-described memory cell constituted by one MOS transistor.

As illustrated in FIGS. 3A to 3D, a dynamic flash memory (DFM) cell 111 is constituted by a MOS transistor without capacitors (refer to Japanese Patent No. 7057032 and K. Sakui, N. Harada, "Dynamic Flash Memory with Dual Gate Surrounding Gate Transistor (SGT)", Proc. IEEE IMW, pp. 72-75 (2021)). As illustrated in FIG. 3A, a floating-body semiconductor base material 102 is positioned on a $SiO_2$ layer 101 of a SOI substrate. An N+ layer 103 connected to a source line SL and an N+ layer 104 connected to a bit line BL are positioned at respective ends of the floating-body semiconductor base material 102. A first gate insulating layer 109*a* is connected to the N+ layer 103 and covers the floating-body semiconductor base material 102, and a second gate insulating layer 109*b* is connected to the N+ layer 104 and the first gate insulating layer 109*a* through a slit insulating film 110 and covers the floating-body semiconductor base material 102. A first gate conductor layer 105*a* covers the first gate insulating layer 109*a* and is connected to a plate line PL, and a second gate conductor layer 105*b* covers the second gate insulating layer 109*b* and is connected to a word line WL. The slit insulating film 110 is positioned between the first gate conductor layer 105*a* and the second gate conductor layer 105*b*. Accordingly, the memory (DEM) cell 111 is formed. The source line SL may be connected to the N+ layer 104, and the bit line BL may be connected to the N+ layer 103.

As illustrated in FIG. 3A, for example, zero voltage is applied to the N+ layer 103 and positive voltage is applied to the N+ layer 104 so that a first N-channel MOS transistor region provided by the floating-body semiconductor base material 102 covered by the first gate conductor layer 105*a* is operated as a saturated region, and a second N-channel MOS transistor region provided by the floating-body semiconductor base material 102 covered by the second gate conductor layer 105*b* is operated as a linear region. As a result, an inversion layer 107*b* is formed on the entire surface of the second N-channel MOS transistor region without a pinch-off point. The inversion layer 107*b* formed below the second gate conductor layer 105*b* connected to the word line WL functions as an effective drain of the first N-channel MOS transistor region. As a result, electric field is maximum in a boundary semiconductor base material between the first N-channel MOS transistor region and the second N-channel MOS transistor region, and an impact ionization phenomenon occurs in this region. As illustrated in FIG. 3B, among electrons and holes generated through the impact ionization phenomenon, the electrons are removed from the floating-body semiconductor base material 102 but some or all of these holes 106 are held in the floating-body semiconductor base material 102. In this manner, memory write operation is performed. This state is allocated as logical storage data "1".

As illustrated in FIG. 3C, for example, positive voltage is applied to the plate line PL, zero voltage is applied to the word line WL and the bit line BL, and negative voltage is applied to the source line SL so that the holes 106 are removed from the floating-body semiconductor base material 102 to perform erase operation. This state is allocated as logical storage data "0". At data reading, voltage applied to the first gate conductor layer 105*a* connected to the plate line PL is set to be higher than threshold voltage for logical storage data "1" and lower than threshold voltage for logical storage data "0". Accordingly, such a characteristic is obtained that no current flows when voltage of the word line WL is set to be high at reading of logical storage data "0" as illustrated in FIG. 3D. With this characteristic, the operation margin is significantly expanded as compared to a DRAM memory cell constituted by one MOS transistor without capacitors. In this memory cell, since channels in the first and second N-channel MOS transistor regions with gates that are the first gate conductor layer 105*a* connected to the plate line PL and the second gate conductor layer 105*b* connected to the word line WL are connected to each other through the floating-body semiconductor base material 102, voltage variation of the floating-body semiconductor base material 102 when select pulsed voltage is applied to the word line WL is largely suppressed. Accordingly, the problems of the above-described memory cell, such as operation margin decrease or data retention characteristic decrease due to removal of some of holes as signal electric charge accumulated in a channel, are largely improved. Further characteristic improvement will be required for such a memory element in the future.

A known dynamic flash memory cell 8 illustrated in FIG. 4 is constituted by a MOS transistor without capacitors and including three gates (refer to US2023/0186966 A1 and K. Sakui, Y. Li, M. Kakumu, K. Kanazawa, I. Kunishima, Y. Iwata, and N. Harada, "Design Impact on Three Gate Dynamic Flash Memory (3G DEM) for Long Hole Retention Time and Robust Disturbance Shield," in Memories-Materials, Devices, Circuits and Systems, Elsevier, 4, 100054, pp. 1-5, May 2023). A silicon semiconductor pillar (Si pillar) 2 is positioned on a substrate 1. The Si pillar 2 is provided with an $N^+$ layer 3*a*, a P layer 7, and an $N^+$ layer 3*b* from the lower side. The P layer 7 between the $N^+$ layers 3*a* and 3*b* serves as a channel region 7*a*. The Si pillar 2 is surrounded by a first gate insulating layer 4*a*, a second gate insulating layer 4*b*, and a third gate insulating layer 4*c* from the lower side. The first gate insulating layer 4*a* is surrounded by a first gate conductor layer 5*a*, the second gate insulating layer 4*b* is surrounded by a second gate conductor layer 5*b*, and the third gate insulating layer 4*c* is surrounded by a third gate conductor layer 5*c*. The first gate conductor layer 5*a* and the second gate conductor layer 5*b* are separated from each other by an insulating layer 6*a*, and the second gate conductor layer 5*b* and the third gate conductor layer 5*c* are separated from each other by an insulating layer 6*b*. Accordingly, the $N^+$ layers 3*a* and 3*b*, the P layer 7, the first gate insulating layer 4*a*, the second gate insulating layer 4*b*, the third gate insulating layer 4*c*, the first gate conductor layer 5*a*, the second gate conductor layer 5*b*, and the third gate conductor layer 5*c* form a dynamic flash memory cell. This structure is characterized in that recombination of holes stored in the channel region 7*a* between the $N^+$ layers 3*a* and 3*b* is significantly suppressed in the $N^+$ layers 3*a* and 3*b* by utilizing electric shielding from the first gate conductor layer 5*a* and the third gate conductor layer 5*c*. As a result, a data "1" retention characteristic (retention) is significantly improved. Note that the dynamic flash memory cell can be provided in the horizontal direction with respect to the substrate 1 and a plurality of memory cells can be stacked in the vertical direction to increase scale of integration (refer to US2022/0367681 A1). Moreover, it is possible to divide the first gate conductor layer 5*a*, the second gate conductor layer 5*b*, and the third gate conductor layer 5*c* (refer to US2022/0367473 A1 and K. Sakui, and N. Harada, "Read Non-Destructive Dynamic Flash Memory (DFM) with Dual and Double Gates," Extended Abstracts of the 2022 International Conference on Solid State Devices and Materials, pp. 405-406, September 2022, for example).

A thyristor RAM memory including three gates without capacitors is disclosed (refer to W.-C. Chen, H.-T. Lue, M.-Y. Wu, T.-H. Yeh, P.-Y. Du, T.-H. Hsu, C.-C. Hsieh, K.-C. Wang, and C.-Y. Lu, "A 3D Stackable DRAM: Capacitor-less Three-Wordline Gate-Controlled Thyristor (GCT) RAM with >40 μA Current Sensing Window, >1010 Endurance, and 3-second Retention at Room Temperature," in IEEE IEDM (International Electron Devices Meeting), pp. 607-610, December 2022, and W.-C. Chen, H.-T. Lue, T.-H. Hsu, K.-C. Wang, and C.-Y. Lu, "A Simulation Study of Scaling Capability toward 10 nm for the 3D Stackable Gate-Controlled Thyristor (GCT) DRAM Device," in IEEE IMW (International Memory Workshop), pp. 25-28, May 2023). The thyristor memory has an advantage that a plurality of layers are stacked to allow for reduction in the equivalent memory cell size, but has a problem that the readout current value significantly increases and decreases because a thyristor is used as a readout mechanism, which results in increase of electric power consumption.

A 1T1C DRAM cell that includes a capacitor and can be stacked is disclosed (refer to M. Huang, S. Si, Z. He, Y. Zhou, S. Li, H. Wang, J. Liu, D. Xie, M. Yang, K. You, C. Choi, Y. Tang, X. Li, S. Qian, X. Yang, L. Hou, W. Bai, Z. Liu, Y. Tang, Q. Wu, Y. Wang, T. Dou, J. Kim, G.-L. Wang, J. Bai, A. Takao, C. Zhao, A. Yoo, M. Zhou, "A 3D Stackable 1T1C DRAM: Architecture, Process Integration and Circuit Simulation," in IEEE IMW (International Memory Workshop), pp. 29-32, May 2023, and J. W. Han, S. H. Park, M. Y. Jeong, K. S. Lee, K. N. Kim, H. J. Kim, J. C. Shin, S. M. Park, S. H. Shin, S. W. Park, K. S. Lee, J. H. Lee, S. H. Kim, B. C Kim, M. H. Jung, I. Y. Yoon, H. Kim, S. U. Jang, K. J. Park, Y. K. Kim, I. G. Kim, J H Oh, S. Y. Han, B. S. Kim, B. J. Kuh, and J. M. Park, "Ongoing Evolution of DRAM Scaling via Third Dimension-Vertically Stacked DRAM," in 2023 Symposium on VLSI Technology and Circuits Digest of Technical Papers, TFS1-1, pp. 1-2, June 2023). However, a capacitor of a DRAM memory cell has a large aspect ratio of 50. Accordingly, the area of the capacitor is extremely large when the DRAM cell is horizontally placed, and thus, for example, 200 layers need to be stacked to obtain an economic equivalent area of the memory cell like the current vertically placed DRAM cell.

A structure in which DRAM memory cells constituted by one MOS transistor without capacitors are stacked is disclosed (refer to US2023/0106561 A1). The structure has a problem that when on-voltage is applied to a select word line, the floating-body channel voltage of a select memory cell connected to the select word line largely varies due to capacitive coupling between the gate electrode and the channel. The structure also has a problem of selectiveness because, for example, a common floating body FB1 is controlled by two word lines WL0 and WL1 as illustrated in FIG. 1F of US2023/0106561 A1. As a workaround, a method of grounding alternate word lines as shield lines as illustrated in FIG. 1G is provided, but with this method, memory capacity is halved and cost is doubled.

SUMMARY OF THE INVENTION

In a dynamic flash memory cell, it is required to achieve a memory cell with a smaller effective cell size.

To solve the above-described problem, a memory device including a semiconductor element according to a first invention of the present application further includes:

- a plurality of semiconductor memory cells arranged in a matrix on a substrate, the semiconductor memory cells including a first memory cell and a second memory cell, the first memory cell including a first semiconductor base material extending in a vertical direction or a horizontal direction with respect to the substrate, the second memory cell including a second semiconductor base material separated from the first semiconductor base material in the vertical direction or the horizontal direction and overlapping the first semiconductor base material in a plan view in the case of separation in the vertical direction or in a sectional view in the case of separation in the horizontal direction;
- a first impurity region and a second impurity region connected to respective ends of the first semiconductor base material;
- a third impurity region and a fourth impurity region connected to respective ends of the second semiconductor base material;
- a first gate insulating layer being in contact with a side surface facing the second semiconductor base material among side surfaces of the first semiconductor base material, and a second gate insulating layer being in contact with a side surface facing the first semiconductor base material among side surfaces of the second semiconductor base material; and
- a first gate conductor layer and a second gate conductor layer being in contact with the first and second gate insulating layers and separated from each other.

The first and third impurity regions are connected to a source line, the second impurity region is connected to a first bit line, the fourth impurity region is connected to a second bit line, one of the first gate conductor layer and the second gate conductor layer is connected to a select gate line, and the other is connected to a plate line.

According to a second invention of the present application, in the above-described first invention, a first shield gate conductor layer and a second shield gate conductor layer in contact with the first and second gate insulating layers of the first and second semiconductor base materials are provided on a side surface opposite the first and second gate conductor layers.

According to a third invention of the present application, in the above-described first invention, the first and second semiconductor base materials overlap each other in a sectional view of the substrate, and the plate line and the select gate line are disposed parallel to the substrate in a plan view.

According to a fourth invention of the present application, in the above-described first invention, the first and second semiconductor base materials overlap each other in a sectional view of the substrate, and the plate line and the select gate line are disposed vertical to the substrate and parallel to each other in a plan view.

According to a fifth invention of the present application, in the above-described first invention, the bit line is disposed perpendicular to the plate line and the select gate line in a vertical sectional view with respect to the substrate.

According to a sixth invention of the present application, in the above-described first invention, the first and second semiconductor base materials overlap each other in a plan view of the substrate, and the plate line and the select gate line are disposed vertical to the substrate and parallel to each other in a sectional view.

According to a seventh invention of the present application, in the above-described first invention, the bit line is disposed perpendicular to the plate line and the select gate line in a plan view with respect to the substrate.

According to an eighth invention of the present application, in the above-described first invention, the select gate line is formed with a first select gate line and a second select gate line separated from each other, one of the first and second gate conductor layers is divided into two, one of the divided gate conductor layers is connected to the first select gate line, the other is connected to the second select gate line, the first or second gate conductor layer not divided is connected to the plate line, and the two gate conductor layers connected to the first and second select gate lines are disposed on respective sides of the gate conductor layer connected to the plate line.

According to a ninth invention of the present application, in the above-described third invention, a third shield gate line separated from the first or second shield gate line is further included, one of the first and the second shield gate conductor layers is divided into two, and one of the divided gate conductor layers is connected to the third shield gate line.

According to a tenth invention of the present application, in the above-described eighth invention, the channel length of the gate conductor layer connected to the plate line is longer than the channel length of a gate conductor layer connected to the first and second select gate lines.

According to an eleventh invention of the present application, in the above-described third invention, the shield lines are disposed parallel to the select gate line and the plate line.

According to a twelfth invention of the present application, in the above-described first invention, the memory cells are configured to control voltages applied to the first to fourth impurity regions and the first to second gate conductor layers to perform a data write operation that allows some or all holes or electrons, which are majority carriers generated through an impact ionization phenomenon due to current flowing in one of the first and second semiconductor base materials or through gate-induced drain leakage current, to remain within the first or second semiconductor base material, and during a data writing duration, a data write prohibition operation that does not cause an impact ionization phenomenon nor gate-induced drain leakage current in the other of the first and second semiconductor base materials and does not allow some or all of the holes or electrons that are majority carriers to remain within the first or second semiconductor base material, and perform a data erase operation that extracts the remaining holes or electrons from one or both of the first and second impurity regions and one or both of the third and fourth impurity regions, and a data read operation that allows or does not allow current to flow in the first or second semiconductor base material depending on stored data in a data written state or a data erased state in one of the first and second semiconductor base materials, and the data write operation, the data write prohibition operation, and the data read operation are independently performed on the first and second memory cells by controlling voltages applied to the source line, the first bit line, the second bit line, the plate line, and the select gate line, the plate line and the select gate line being common to the first and second memory cells.

According to a thirteenth invention of the present application, in the above-described twelfth invention, the first and second shield gate conductor layers are connected to first and second shield lines, and a ground voltage is applied to the first and second shield lines in the data write operation, the data write prohibition operation, and the data read operation.

According to a fourteenth invention of the present application, in the above-described thirteenth invention, the ground voltage is zero volt.

According to a fifteenth invention of the present application, the plurality of semiconductor memory cells according to the above-described first invention are arranged in a matrix on a substrate to form memory blocks, and a plurality of the memory blocks are selected during at least one of the data write operation, the data erase operation, and the data read operation.

DETAILED DESCRIPTION OF THE PREFERRED EMBODIMENTS

The structure and a drive method of a memory device (hereinafter referred to as a dynamic flash memory) including a semiconductor element according to the present invention will be described below with reference to the accompanying drawings.

First Embodiment

Figure 1A:
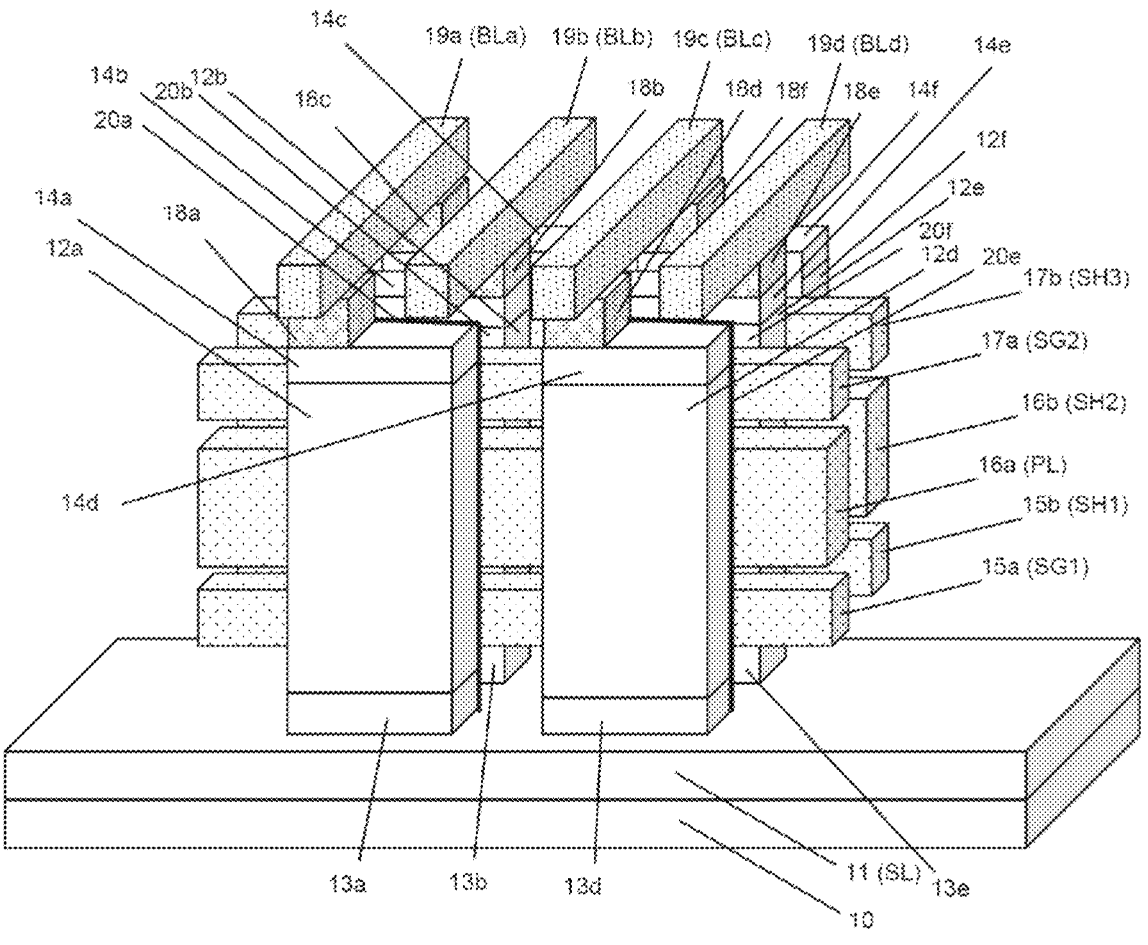
FIG. 1A is a structural diagram of a memory cell according to a first embodiment.
Figure 1B:
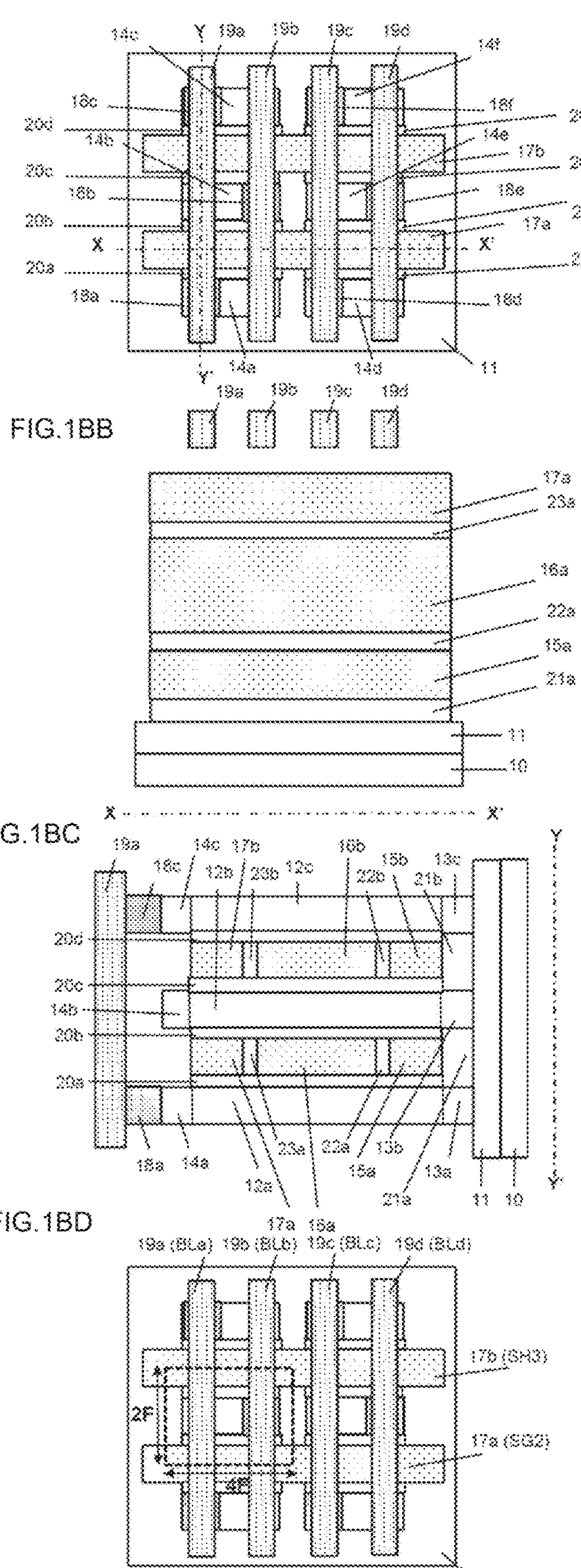
FIGS. 1BA, 1BB, 1BC and 1BD are structural diagrams of the memory cell according to the first embodiment.
Figure 1C:
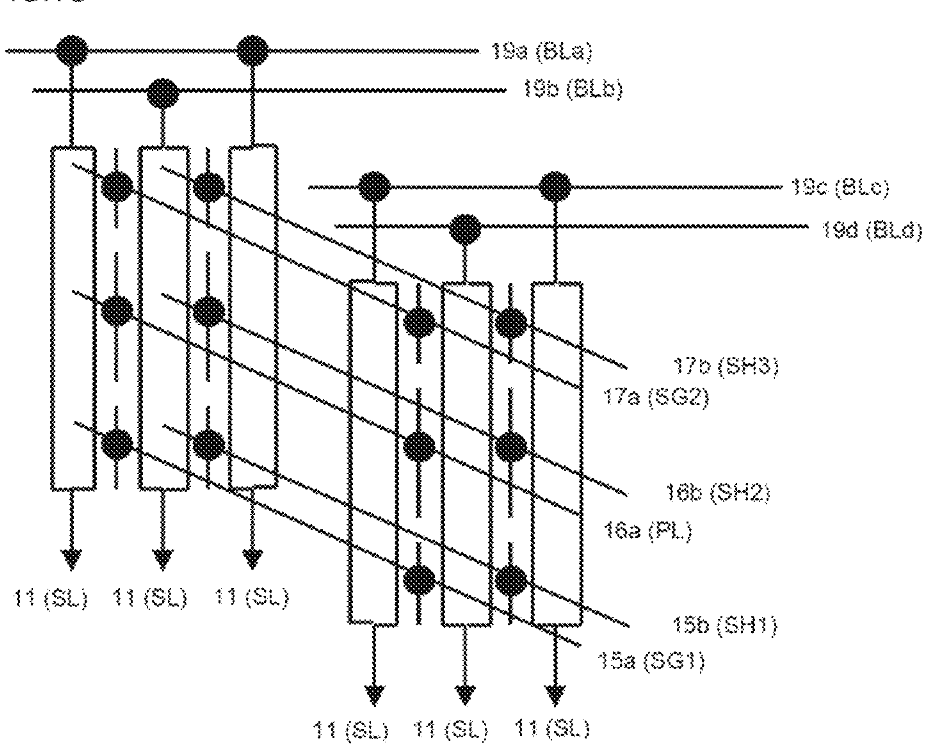
FIG. 1C is a structural diagram of the memory cell according to the first embodiment.
Figure 1D:
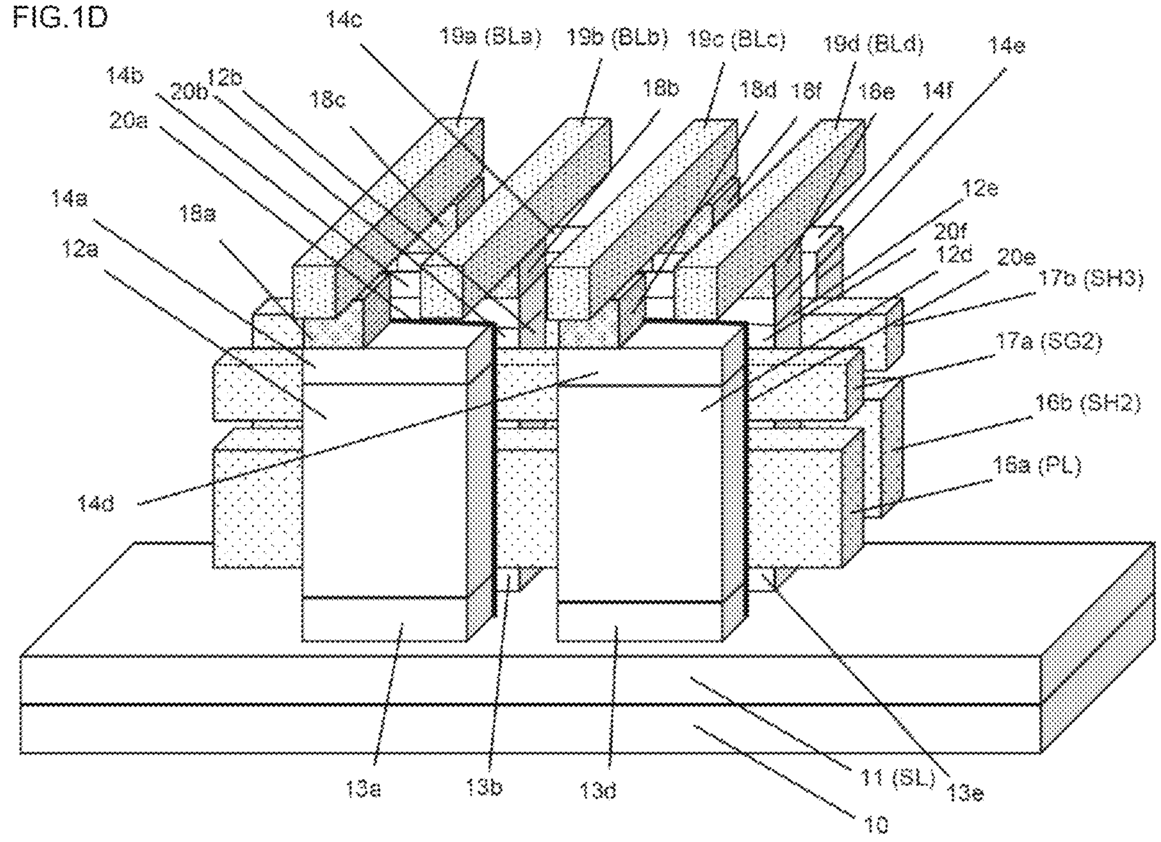
FIG. 1D is a structural diagram of the memory cell according to the first embodiment.
Figure 1E:
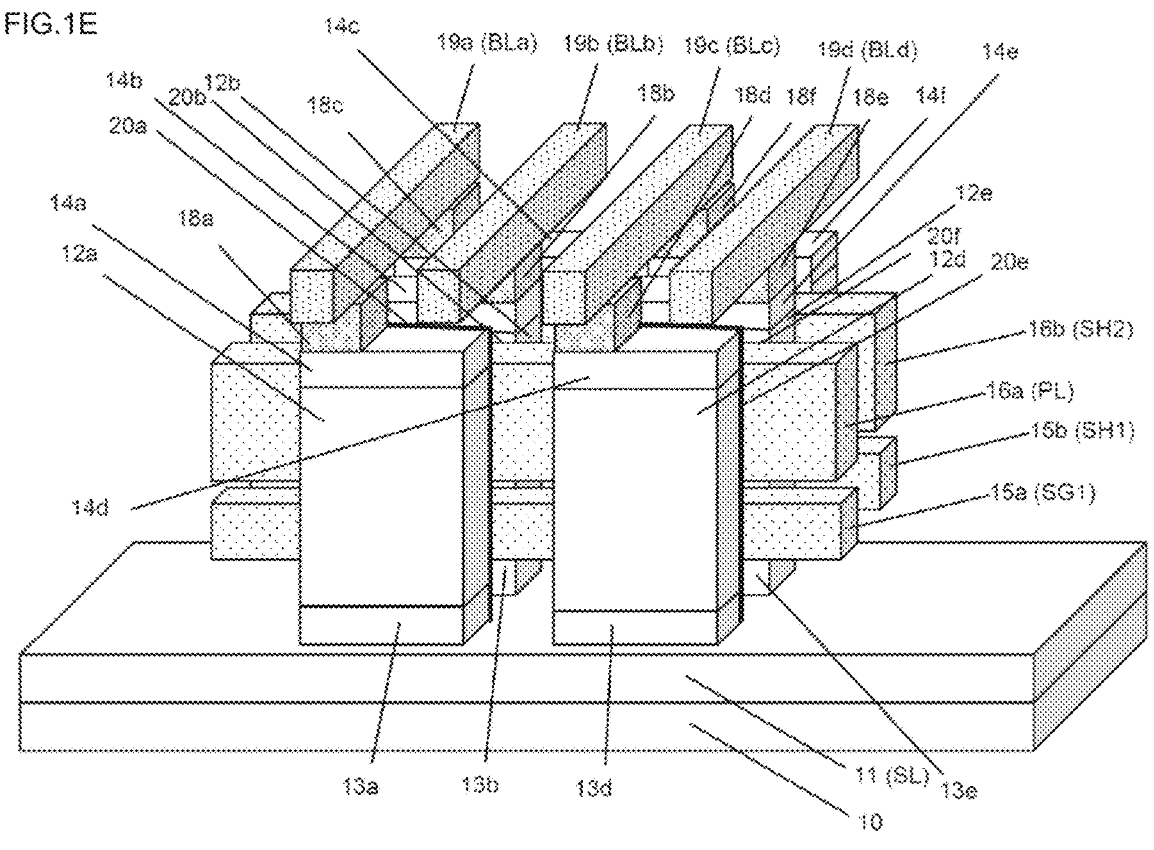
FIG. 1E is a structural diagram of the memory cell according to the first embodiment.

The structure, operation mechanism, and manufacturing method of a dynamic flash memory cell according to a first embodiment of the present invention will be described below with reference to FIGS. 1A to 1E. Description with reference to FIGS. 1A, 1BA, 1BB, 1BC and 1BD is made on a structure in which bit lines 19*a* (BLa) to 19*d* (BLd) are disposed in the horizontal direction with respect to a substrate 10 and first and second select gate lines 15*a* (SG1) and 17*a* (SG2), a plate line 16*a* (PL), and first, second, third shield lines 15*b* (SH1), 16*b* (SH2), and 17*b* (SH3) are disposed in the horizontal direction and perpendicular to the bit lines. FIG. 1C illustrates an equivalent circuit diagram of FIGS. 1A, 1BA, 1BB, 1BC and 1BD. Description with reference to FIGS. 1D and 1E is made on a structural diagram in which the first or second select gate line in FIG. 1A is deleted. Description with reference to FIGS. 2A to 2G is made on a structural diagram and an equivalent circuit diagram in a case where the dynamic flash memory cell according to the first embodiment of the present invention is stacked on the substrate 10 in a plan view or a sectional view.

FIG. 1A illustrates a bird's eye view of the structure of the dynamic flash memory cell according to the first embodiment of the present invention. FIG. 1BA illustrates a plan view of the structure of the dynamic flash memory cell according to the first embodiment of the present invention, and FIGS. 1BB and 1BC illustrate a cross-sectional views in an X-X' line direction and a Y-Y' line direction, respectively, illustrated in FIG. 1BA. A first semiconductor base material 12*a* (example of "first semiconductor base material" in the claims) of the P layer extends perpendicular to the substrate 10 (example of "substrate" in the claims). An $N^+$ layer 13*a* (example of "first impurity region" in the claims) and an $N^+$ layer 14*a* (example of "second impurity region" in the claims) are positioned at upper and lower ends of the first semiconductor base material 12*a*. A second semiconductor base material 12*b* (example of "second semiconductor base material" in the claims) of the P layer is positioned on a depth direction side of the first semiconductor base material 12*a*, and an $N^+$ layer 13*b* (example of "third impurity region" in the claims) and an $N^+$ layer 14*b* (example of "fourth impurity region" in the claims) are positioned at upper and lower ends of the second semiconductor base material 12*b*. A first gate insulating film 20*a* (example of "first gate insulating film" in the claims) and a second gate insulating film 20*b* (example of "second gate insulating film" in the claims) are formed around the first semiconductor base material 12*a* and the second semiconductor base material 12*b*.

A first gate conductor layer 15*a* (example of "first gate conductor layer" in the claims), a second gate conductor layer 16*a* (example of "second gate conductor layer" in the claims), and a third gate conductor layer 17*a* (example of "third gate conductor layer" in the claims) separated from each other are in contact with a side surface of each of the first gate insulating layer 20*a* and the second gate insulating layer 20*b*. The three gate conductor layers of the first to third gate conductor layers 15*a*, 16*a*, and 17*a*, which are illustrated in FIGS. 1A to 1C and 2A to 2D may be two gate conductor layers. Note that, as described later, either of the first gate conductor layer 15*a* and the third gate conductor layer 17*a* may be eliminated as illustrated in FIG. 1D or 1E, respectively.

The first impurity region 13*a* and the third impurity region 13*b* are connected to an $N^+$ layer 11 (example of "source line" in the claims) as a source line, the second impurity region 14*a* is connected to the first bit line 19*a* (BLa) (example of "first bit line" in the claims), and the fourth impurity region 14*b* is connected to the second bit line 19*b* (BLb) (example of "second bit line" in the claims). In this example, the $N^+$ layer 11 as a source line is indicated as an $N^+$ layer formed on the P layer substrate 10 but may be another conductive material. It is also possible to make contact with $N^+$ layer via metal wiring to reduce the resistance of a source line SL. The first gate conductor layer 15*a* is connected to the first select gate line SG1 (example of "first select gate line" in the claims), the second gate conductor layer 16*a* is connected to a plate line PL (example of "plate line" in the claims), and the third gate conductor layer 17*a* is connected to the second select gate line SG2 (example of "second select gate line" in the claims). The first gate conductor layer 15*b* (example of "first shield gate conductor layer" in the claims), the second gate conductor layer 16*b* (example of "second shield gate conductor layer" in the claims), and the third gate conductor layer 17*b* (example of "third shield gate conductor layer" in the claims) separated from each other on a side surface opposite the second semiconductor base material 12*b* are in contact with a side surface of a second gate insulating layer 20*c*. The first shield gate conductor layer 15*b* is connected to the first shield gate line SH1 (example of "first shield gate line" in the claims), the second shield gate conductor layer 16*b* is connected to a second shield gate line SH2 (example of "second shield gate line" in the claims), and the third shield gate conductor layer 17*b* is connected to a third shield gate line SH3 (example of "third shield gate line" in the claims).

Eight terminals of a first memory cell (example of "first memory cell" in the claims) are constituted by the first select gate line SG1, the plate line PL, the second select gate line SG2, the first shield gate line SH1 (not illustrated), the second shield gate line SH2 (not illustrated), the third shield gate line SH3 (not illustrated), the source line SL, and the bit line BLa. Eight terminals of a second memory cell (example of "second memory cell" in the claims) are constituted by the first select gate line SG1, the plate line PL, the second select gate line SG2, the first shield gate line SH1 (illustrated), the second shield gate line SH2 (illustrated), the third shield gate line SH3 (illustrated), the source line SL, and the bit line BLb.

For example, in a case where the first memory cell is selected, the source line SL applies a ground voltage Vss, a positive voltage is applied to the first and second bit lines BLa and BLb, and voltages applied to the plate line PL, the first select gate line SG1, and the second select gate line SG2 are controlled to apply a ground voltage (example of "ground voltage" in the claims) to the first, second, and third shield gate lines SH1, SH2, and SH3. A data write operation (example of "data write operation" in the claims), a data write prohibition operation (example of "data write prohibition operation" in the claims), or a data read operation (example of "data read operation" in the claims) is performed on the first and second memory cells. For example, the data write prohibition operation is performed on the second memory cell when the data write operation is performed on the first memory cell. Voltages applied to the source line SL, the bit lines BL, the plate line PL, the first select gate line SG1, and the second select gate line SG2 are controlled to perform a data erase operation (example of "data erase operation" in the claims) on the first and second memory cells. Note that the data erase operation may be independently performed on the first and second memory cells.

Note that, as illustrated in FIG. 1B, the first to third gate conductor layers 15*a*, 16*a*, and 17*a* are gate conductor layers common to two dynamic flash memory cells with the first semiconductor base material 12*a* and the second semiconductor base material 12*b* as channels. Note that the first gate insulating film 20*a* needs to be provided at least between the first to third gate conductor layers 15*a*, 16*a*, and 17*a* and the first semiconductor base material 12*a*. Similarly, the second gate insulating film 20*b* needs to be provided at least between the first to third gate conductor layers 15*a*, 16*a*, and 17*a* and the second semiconductor base material 12*b*.

FIG. 1BD specifically illustrates one memory cell size in the cell arrangement diagram of FIG. 1BA with dashed lines. With a design rule as F (Feature Size), one memory cell has a longitudinal length of 2F, a lateral length of 4F, and a memory size of 8F2 (2F×4F). Although the current DRAM memory cell size is 6F2, the dynamic flash memory cell according to the first embodiment of the present invention does not include capacitors, allowing for cost reduction, unlike the DRAM memory cell size. Moreover, as the number of stacked layers increases, a stacked dynamic flash memory cell to be described later with reference to FIGS. 2A to 2D allows for reduction in the equivalent memory cell size and can be provided at a lower cost.

In FIG. 1A, the channel length (length in the X-X' line direction) of the plate line PL is longer than the select gate lines SG1 and SG2. With this configuration, it is possible to excellently control plate line voltage to the floating body of the memory cell. Moreover, a larger number of holes can be held in the floating body in a 1-written state in accordance with the channel length (gate length) of the plate line.

FIG. 1C illustrates an equivalent circuit diagram of FIGS. 1A and 1B. As illustrated in FIGS. 1A to 1C, in the first and second memory cells selected by the common select gate lines SG1 and SG2 and plate line PL, one of the two bit lines BLa and BLb is connected to each memory cell whereas the other bit line is connected to no memory cell but passes through. With such an architecture, even though the select gate lines SG1 and SG2 and the plate line PL are common, it is possible to independently control the first memory cell with the bit line BLa and the second memory cell with the bit line BLb.

FIG. 1D illustrates an example in which the first select gate line SG1 adjacent to the source line SL in FIG. 1A is eliminated. A gate line is constituted by the second select gate line SG2 and the plate line PL. FIG. 1E illustrates an example in which the second select gate line SG2 adjacent to the bit lines BLa and BLb in FIG. 1A is eliminated. A gate conductor layer is constituted by the first select gate line SG1 and the plate line PL. With this configuration, it is possible to further miniaturize the cell size of the dynamic flash memory cell. Moreover, it is possible to increase cell current and further increase in operation speed. Eliminating one of the select gates has drawback of reducing data retention capability but provides excellent controllability of plate line voltage to the floating body of the memory cell. Moreover, a larger number of holes can be held in the floating body in the 1-written state in accordance with the gate length of the plate line. Selection of a structure to be used depends on use application of the dynamic flash memory cell.

Figure 2A:
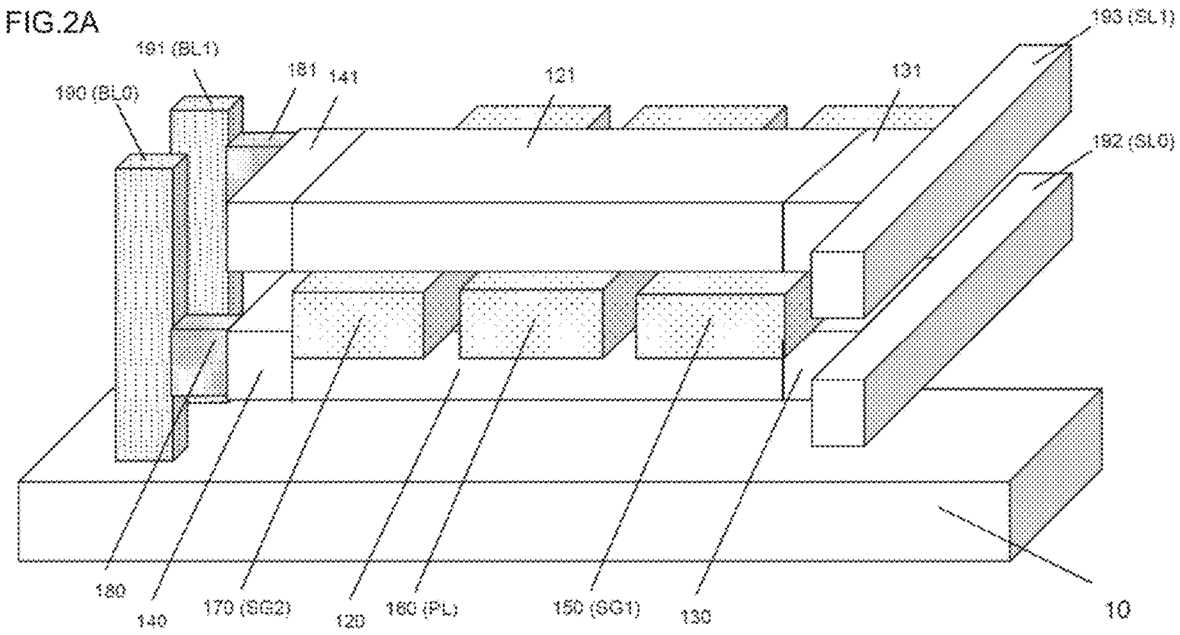
FIG. 2A is a structural diagram of the memory cell according to the first embodiment.

FIG. 2A illustrates an example in which two dynamic flash memory cells are stacked in the vertical direction with respect to the substrate 10. A second semiconductor base material 121 is positioned above a first semiconductor base material 120. A first gate conductor layer 150 connected to the select gate line SG1, a second gate conductor layer 160 connected to the plate line PL, and a third gate conductor layer 170 connected to the select gate line SG2 are positioned between the first semiconductor base material 120 and the second semiconductor base material 121. $N^+$ layers 130 and 140 are positioned at respective ends of the first semiconductor base material 120. The $N^+$ layer 130 is connected to a first source line 192 (SL0), and the $N^+$ layer 140 is connected to a first bit line 190 (BL0). $N^+$ layers 131 and 141 are positioned at respective ends of the second semiconductor base material 121. The $N^+$ layer 131 is connected to a second source line 193 (SL1), and the $N^+$ layer 141 is connected to a second bit line 191 (BL1).

Figure 2B:
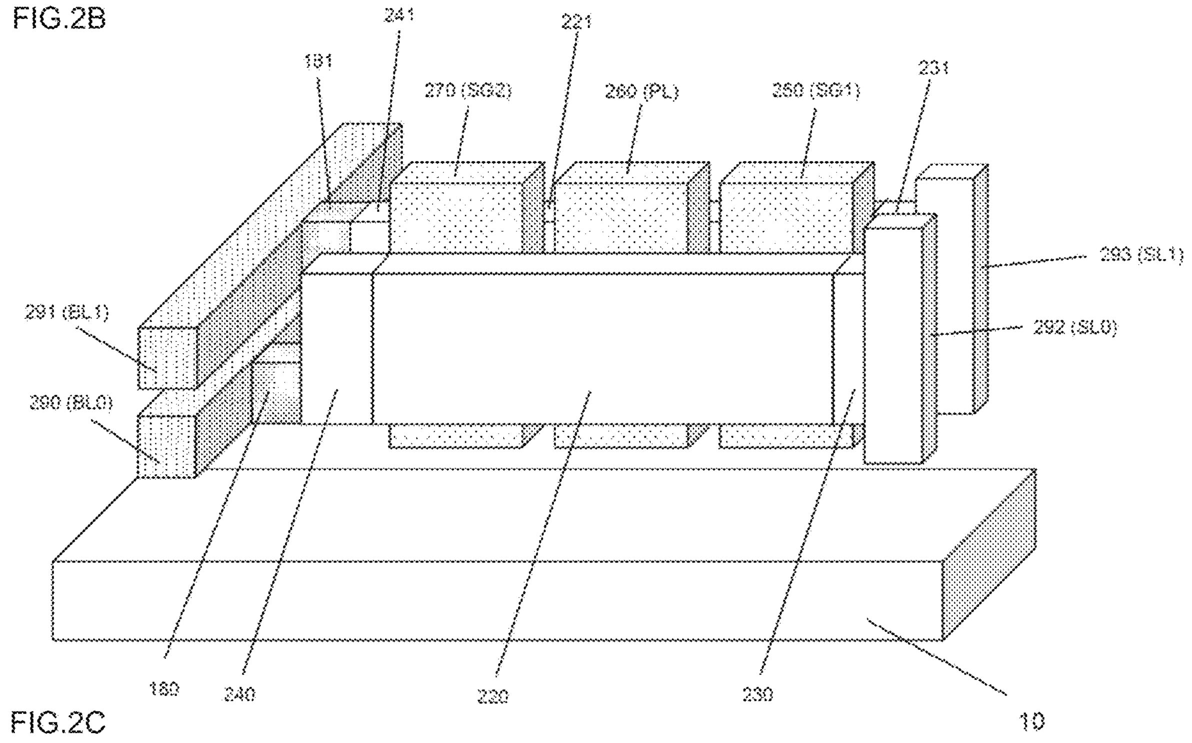
FIG. 2B is a structural diagram of the memory cell according to the first embodiment.

FIG. 2B illustrates an example in which the select gate lines SG, the plate line PL, and the source line SL are disposed in the vertical direction and the bit lines BL are disposed in the horizontal direction with respect to the substrate 10. In other words, the example corresponds to a dynamic flash memory cell obtained by rotating the dynamic flash memory cell illustrated in FIG. 2A by 90° toward the back of the drawing relative to the substrate 10. Either structure can be selected in accordance with use application. The dynamic flash memory cell in FIG. 2B has the same main characteristic as the dynamic flash memory cell illustrated in FIG. 2A.

Figure 2C:
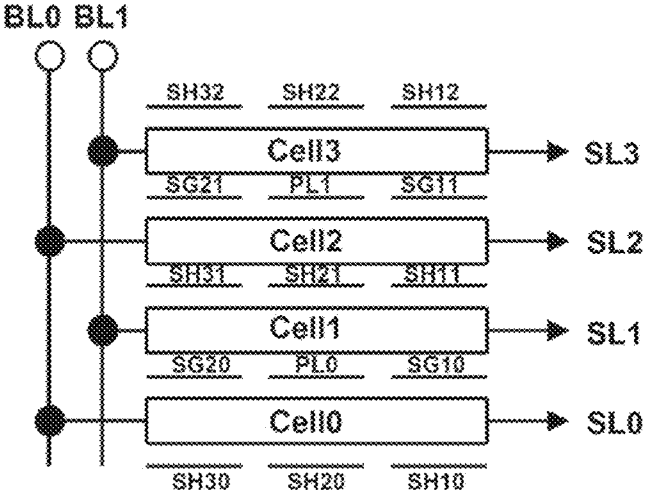
FIG. 2C is a structural diagram of the memory cell according to the first embodiment.

FIG. 2C illustrates an equivalent circuit diagram of the dynamic flash memory cell according to the first embodiment of the present invention in a case where four memory cells Cell0 to Cell3 are stacked on the substrate in a plan view or a sectional view.

Figure 2D:
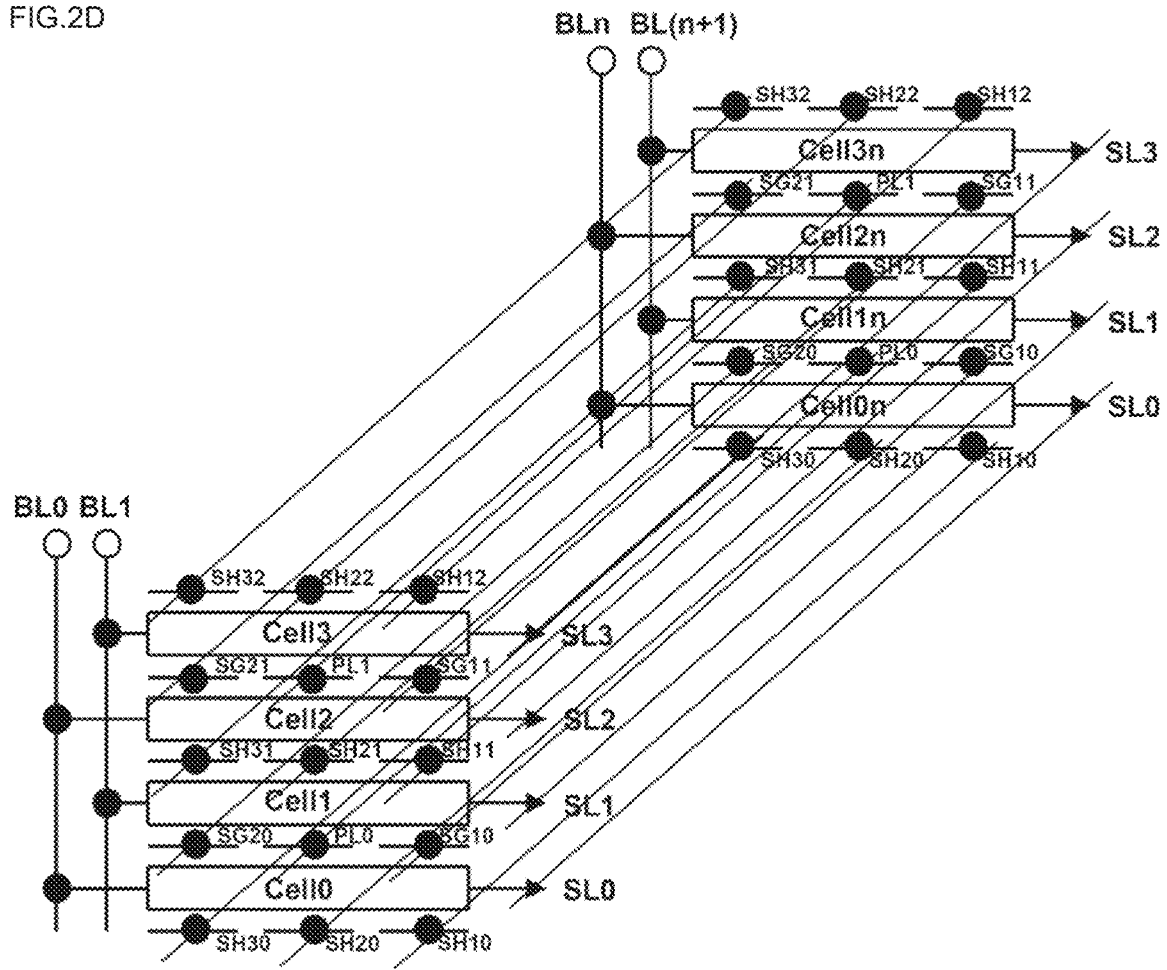
FIG. 2D is a structural diagram of the memory cell according to the first embodiment.

FIG. 2D illustrates a bird's eye view of a configuration in which the bit line column in the equivalent circuit diagram of FIG. 2C is increased to BL (n+1) in the depth direction. For example, in a case where n in BL (n+1) is 1022, the number of bit lines is 1024. The data write operation from a sense amplifier circuit (not illustrated) or the data read operation to the sense amplifier circuit is simultaneously performed on the bit line column.

Figure 2E:
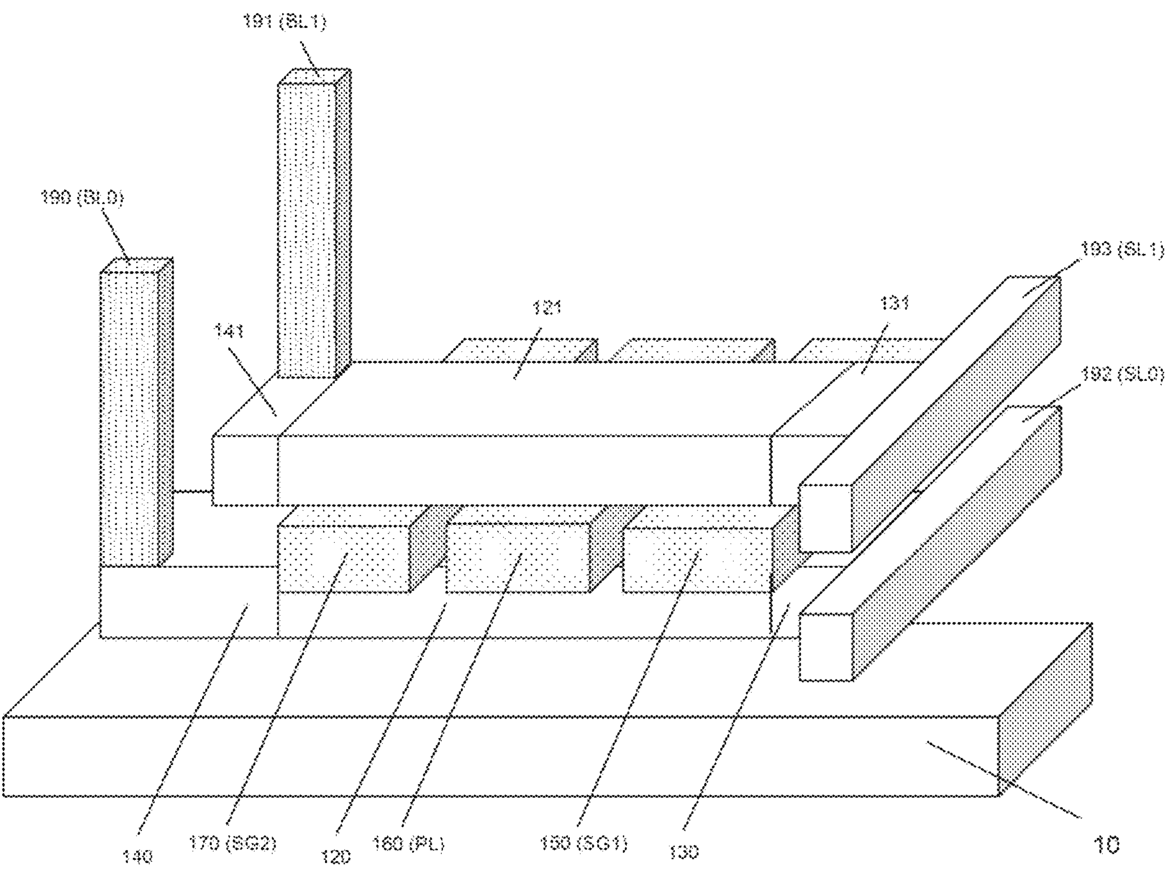
FIG. 2E is a structural diagram of the memory cell according to the first embodiment.

FIG. 2E is a structural diagram of a stacked dynamic flash memory cell in which the select gate lines SG and the plate line PL are disposed in the horizontal direction with respect to the substrate 10. In this manner, the semiconductor base materials may be disposed in a stepped manner and connected to the bit lines BL.

Figure 2F:
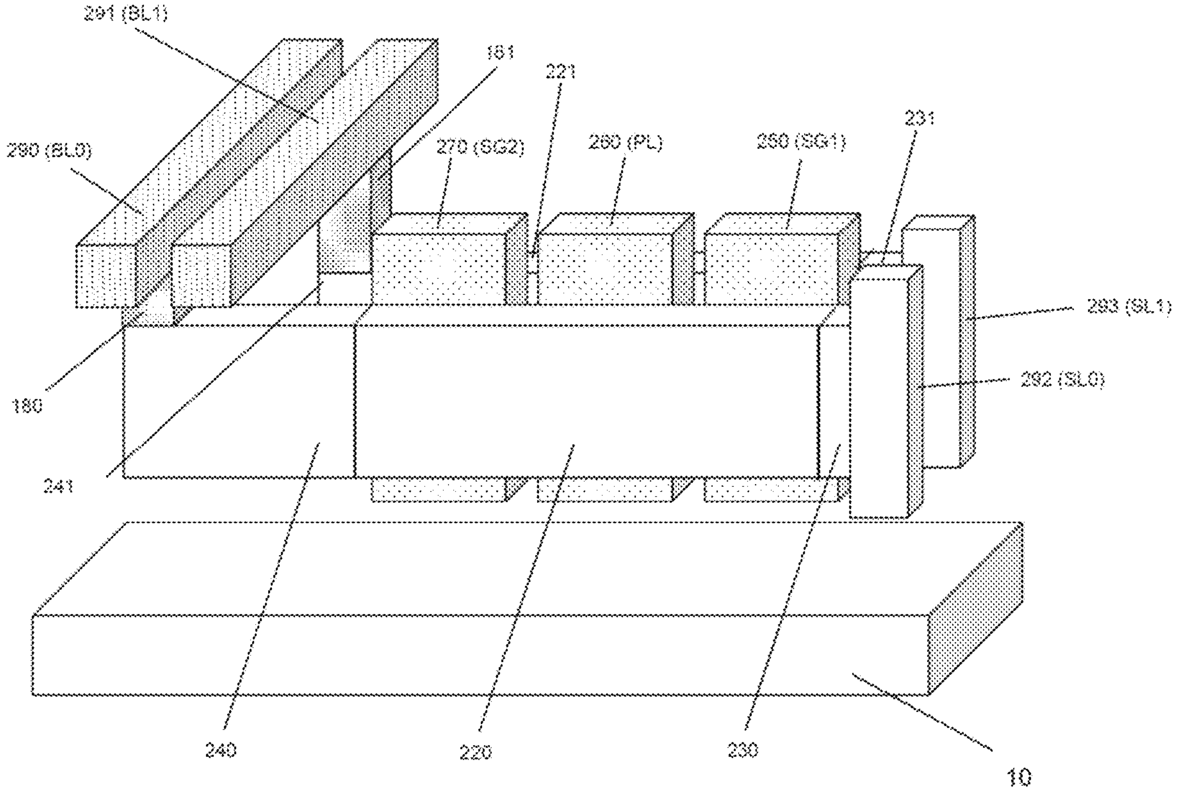
FIG. 2F is a structural diagram of the memory cell according to the first embodiment.

FIG. 2F is a structural diagram of a stacked dynamic flash memory cell in which the select gate lines SG and the plate line PL are disposed in the vertical direction with respect to the substrate 10. In this manner, the semiconductor base materials may have increased lengths and may be connected to the bit lines BL.

Figure 2G:
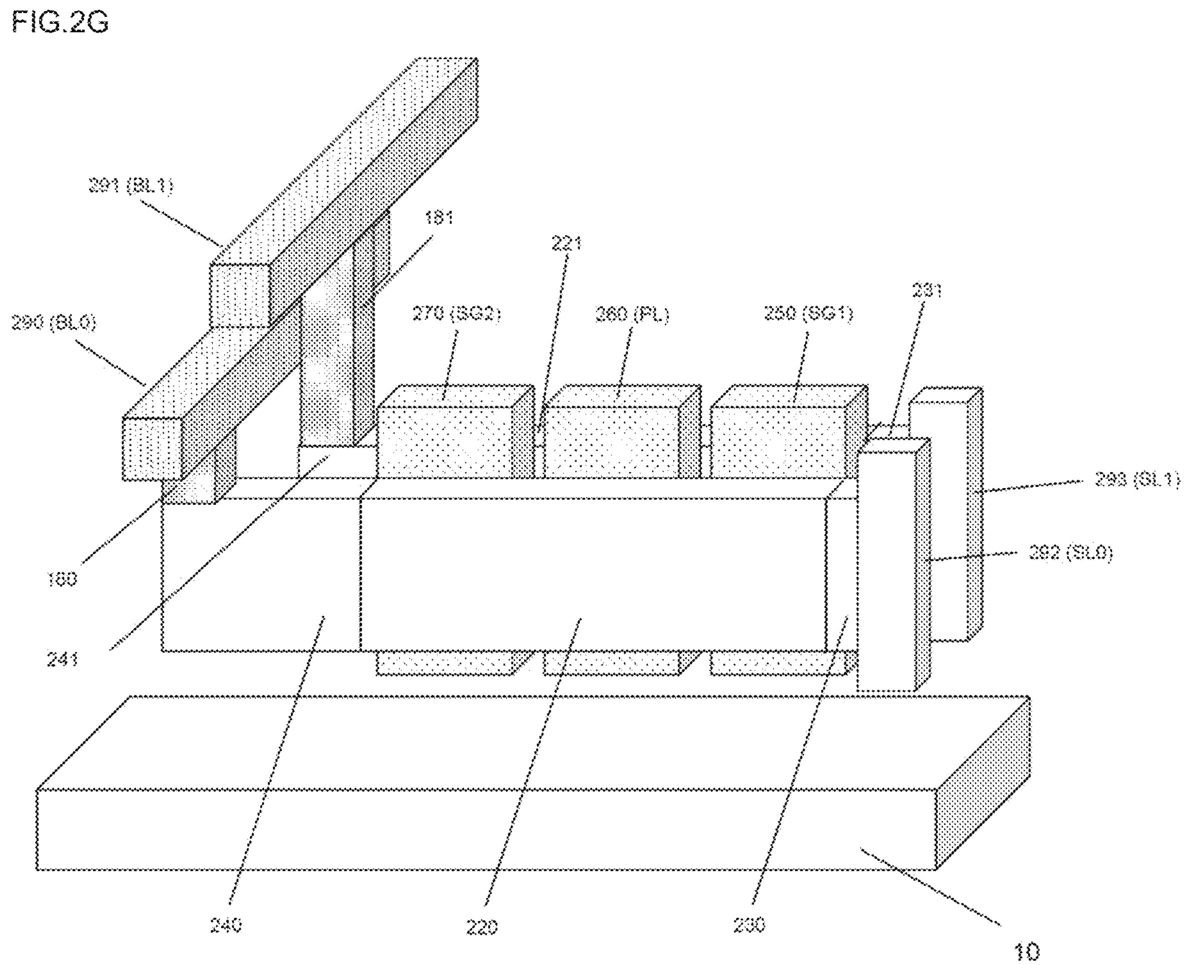
FIG. 2G is a structural diagram of the memory cell according to the first embodiment.
Figure 3A:
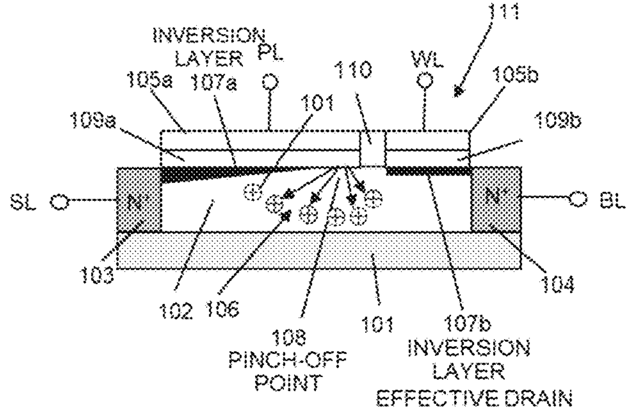
FIGS. 3A to 3D are diagrams for description of a dynamic flash memory cell constituted by a MOS transistor without capacitors according to a conventional example.
Figure 3B:
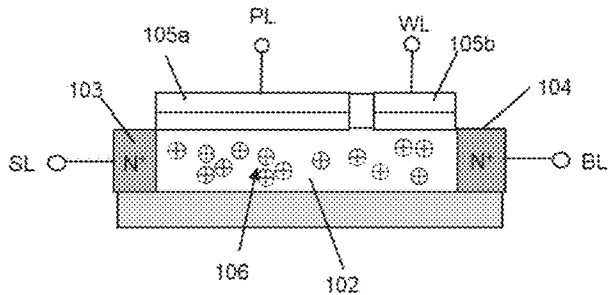
Figure 3C:
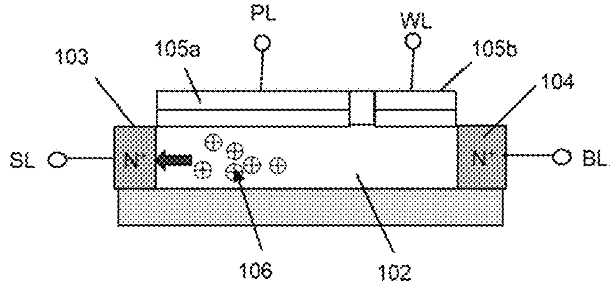
Figure 3D:
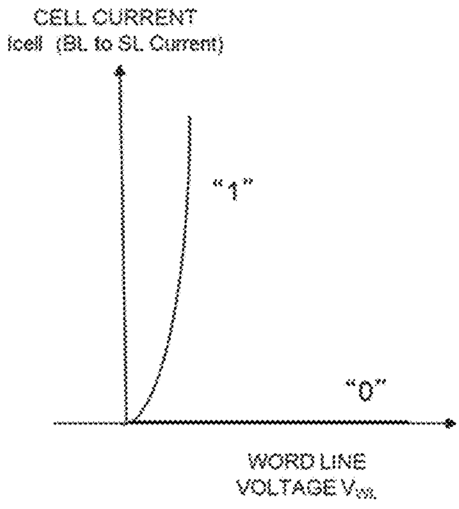
Figure 4:
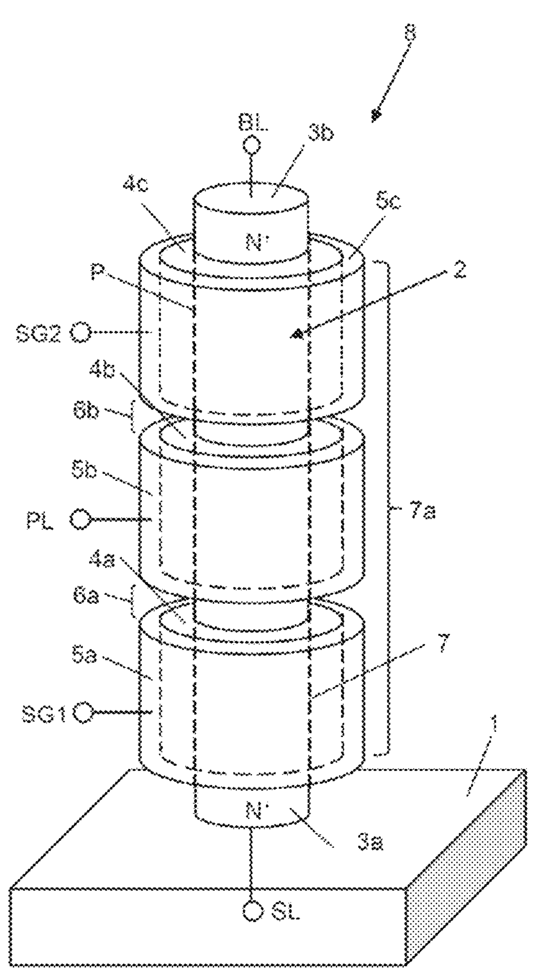
FIG. 4 is a diagram for description of a dynamic flash memory cell constituted by a MOS transistor without capacitors and including three gates according to a conventional example.

FIG. 2G is a structural diagram of a stacked dynamic flash memory cell in which the select gate lines SG and the plate line PL are disposed in the vertical direction with respect to the substrate 10. In this manner, the bit lines BL may be disposed in a hierarchical structure.

Note that constituent components of the dynamic flash memory cells illustrated in FIGS. 1A to 1E and 2A to 2G have shapes with quadrilateral vertical sections in the above description, but these vertical sectional shapes may be other shapes such as trapezoid shapes. Moreover, the vertical sections of constituent components may differ. This is the same in other examples as well.

Dynamic flash memory operation is performed also with a structure in which the conductivities of $N^+$ and P layers of the dynamic flash memory cells illustrated in FIGS. 1A to 1E and 2A to 2G are inverted. In this case, majority carriers in the N-type semiconductor base material are electrons. Accordingly, electrons generated through impact ionization are stored in the floating body, and a "1" state is set. Moreover, dynamic flash memory cells including the P-type semiconductor base material and the N-type semiconductor base material may be formed on the same substrate. This is the same in other examples as well.

It is possible to employ a junction-less structure in which the semiconductor base materials of $N^+$ and P layers of the dynamic flash memory cells illustrated in FIGS. 1A to 1E and 2A to 2G have the same conductivity. This is the same in other examples as well.

The dynamic flash memory cells illustrated in FIGS. 1A to 1E and 2A to 2G may be arranged in a matrix on the substrate to form memory blocks, and a plurality of the memory blocks may be selected during at least one of the data write operation, the data erase operation, and the data read operation. As a result, the number of memory cells selected in the plurality of memory blocks increases, which makes it possible to perform data writing, data erasure, and data reading per cell at higher speed.

The present embodiment has the following characteristics.

Characteristic 1

In the dynamic flash memory cell according to the embodiment of the present invention, with a design rule as F (Feature Size) in a single-layer structure memory cell illustrated in FIGS. 1A to 1D, one memory cell has a longitudinal length of 2F, a lateral length of 4F, and a memory size of 8F2 (2F×4F). Although the current DRAM memory cell size is 6F2, the dynamic flash memory cell of the present invention does not include capacitors, allowing for cost reduction, unlike the DRAM memory cell size. Moreover, the stacked dynamic flash memory cell illustrated in FIGS. 2A to 2G allows for reduction in the equivalent memory cell size and can be provided at a lower cost as the number of stacked layers increases.

Characteristic 2

As illustrated FIGS. 1A to 1E and 2A to 2G, in the first and second memory cells selected by the common select gate lines SG and plate line PL, one of the two bit lines BL is connected to each memory cell whereas the other bit line is connected to no memory cell but passes through. With this architecture, even though the select gate lines SG and the plate line PL are common, it is possible to control the first memory cell and the second memory cell with the bit lines BL independent from each other.

Characteristic 3

As illustrated FIGS. 1A to 1E and 2A to 2G, the shield gate lines are provided on a side opposite the select gate lines SG and the plate line with respect to a semiconductor base material. It is possible to maintain more stable memory operation by applying a ground voltage (zero volt) to the shield gate lines. For example, holes generated through the data write operation can be collected and held in the shield gate line side in the semiconductor base material. Moreover, with the shield gate lines, generated holes can be maintained in the semiconductor base material even when the thickness of the semiconductor base material is reduced. As a result, it is possible to reduce the memory cell size in a single-layer dynamic flash memory cell, and it is possible to reduce the height aspect ratio in a memory cell sectional view in a multi-layer stacked dynamic flash memory cell, thereby increasing the number of stacked layers. As a result, it is possible to provide a semiconductor memory device at a lower cost.

OTHER EMBODIMENTS

Note that gate conductor layers connected to the plate line may be each a single layer or a combination of a plurality of conductor material layers. Similarly, gate conductor layers connected to the second and third select gate lines may be each a single layer or a combination of a plurality of conductor material layers. Moreover, the outside of each gate conductor layer may be connected to a wiring metal layer such as W. This is the same in other embodiments according to the present invention.

The voltage of the plate line PL in description of the embodiment may be a fixed voltage of, for example, 0 V irrespective of each operation mode. Moreover, the voltage of the plate line PL may be a fixed voltage or a temporally changing voltage as long as the voltage satisfies conditions that dynamic flash memory operation is possible.

In FIGS. 1A to 1E, N-type or P-type impurity regions may be provided between the impurity region $N^+$ layers 13*a*, 13*b*, 13*d*, and 13*e* and the second impurity region $N^+$ layers 14*a*, 14*b*, 14*d*, and 14*e*, and the first semiconductor base material P layers 12*a*, 12*b*, 12*d*, and 12*e*. This is the same in other embodiments according to the present invention.

The data write operation may allow some or all holes or electrons, which are majority carriers generated through an impact ionization phenomenon due to current flowing in one of the semiconductor base materials or through gate-induced drain leakage current, to remain within the semiconductor base material.

The present invention can have various embodiments and modifications without departing from the spirit and scope of the present invention. Each above-described embodiment is only intended to describe an example of the present invention and does not limit the scope of the present invention. Any above-described example and modification may be optionally combined. Some constituent components of the above-described embodiment may be omitted as necessary within the technological idea of the present invention.

With a memory device including a semiconductor element according to the present invention, it is possible to obtain a high-density and high-performance dynamic flash memory.

What is claimed is:

1. A memory device including a semiconductor element, the memory device further comprising:

a plurality of semiconductor memory cells arranged in a matrix on a substrate, the semiconductor memory cells including a first memory cell and a second memory cell, the first memory cell including a first semiconductor base material extending in a vertical direction or a horizontal direction with respect to the substrate, the second memory cell including a second semiconductor base material separated from the first semiconductor base material in the vertical direction or the horizontal direction and overlapping the first semiconductor base material in a plan view in the case of separation in the vertical direction or in a sectional view in the case of separation in the horizontal direction;

a first impurity region and a second impurity region connected to respective ends of the first semiconductor base material;

a third impurity region and a fourth impurity region connected to respective ends of the second semiconductor base material;

a first gate insulating layer being in contact with a side surface facing the second semiconductor base material among side surfaces of the first semiconductor base material, and a second gate insulating layer being in contact with a side surface facing the first semiconductor base material among side surfaces of the second semiconductor base material; and a first gate conductor layer and a second gate conductor layer being in contact with the first and second gate insulating layers and separated from each other, wherein the first and third impurity regions are connected to a source line, the second impurity region is connected to a first bit line, the fourth impurity region is connected to a second bit line, one of the first gate conductor layer and the second gate conductor layer is connected to a select gate line, and the other is connected to a plate line.

2. The memory device including a semiconductor element according to claim 1, wherein a first shield gate conductor layer and a second shield gate conductor layer in contact with the first and second gate insulating layers of the first and second semiconductor base materials are provided on a side surface opposite the first and second gate conductor layers.

3. The memory device including a semiconductor element according to claim 1, wherein the first and second semiconductor base materials overlap each other in a sectional view of the substrate, and the plate line and the select gate line are disposed parallel to the substrate in a plan view.

4. The memory device including a semiconductor element according to claim 1, wherein the first and second semiconductor base materials overlap each other in a sectional view of the substrate, and the plate line and the select gate line are disposed vertical to the substrate and parallel to each other in a plan view.

5. The memory device including a semiconductor element according to claim 1, wherein the bit line is disposed perpendicular to the plate line and the select gate line in a vertical sectional view with respect to the substrate.

6. The memory device including a semiconductor element according to claim 1, wherein the first and second semiconductor base materials overlap each other in a plan view of the substrate, and the plate line and the select gate line are disposed vertical to the substrate and parallel to each other in a sectional view.

7. The memory device including a semiconductor element according to claim 1, wherein the bit line is disposed perpendicular to the plate line and the select gate line in a plan view with respect to the substrate.

8. The memory device including a semiconductor element according to claim 1, wherein the select gate line is formed with a first select gate line and a second select gate line separated from each other, one of the first and second gate conductor layers is divided into two, one of the divided gate conductor layers is connected to the first select gate line, the other is connected to the second select gate line, the first or second gate conductor layer not divided is connected to the plate line, and the two gate conductor layers connected to the first and second select gate lines are disposed on respective sides of the gate conductor layer connected to the plate line.

9. The memory device including a semiconductor element according to claim 3, further comprising a third shield gate line separated from the first or second shield gate line, wherein one of the first and the second shield gate conductor layers is divided into two, and one of the divided gate conductor layers is connected to the third shield gate line.

10. The memory device including a semiconductor element according to claim 8, wherein the first semiconductor base material extends in a length direction between the first impurity region and the second impurity region, the gate conductor layer connected to the plate line has a first channel length extending in the length direction, the two gate conductor layers connected, respectively, to the first and second gate lines each have a second channel length, and the first channel length is longer than the second channel length.

11. The memory device including a semiconductor element according to claim 3, wherein the shield lines are disposed parallel to the select gate line and the plate line.

12. The memory device including a semiconductor element according to claim 1, wherein the memory cells are configured to control voltages applied to the first to fourth impurity regions and the first to second gate conductor layers to perform a data write operation that allows some or all holes or electrons, which are majority carriers generated through an impact ionization phenomenon due to current flowing in one of the first and second semiconductor base materials or through gate-induced drain leakage current, to remain within the first or second semiconductor base material, and during a data writing duration, a data write prohibition operation that does not cause an impact ionization phenomenon nor gate-induced drain leakage current in the other of the first and second semiconductor base materials and does not allow some or all of the holes or electrons that are majority carriers to remain within the first or second semiconductor base material, and perform a data erase operation that extracts the remaining holes or electrons from one or both of the first and second impurity regions and one or both of the third and fourth impurity regions, and a data read operation that allows or does not allow current to flow in the first or second semiconductor base material depending on stored data in a data written state or a data erased state in one of the first and second semiconductor base materials, and the data write operation, the data write prohibition operation, and the data read operation are independently performed on the first and second memory cells by controlling voltages applied to the source line, the first bit line, the second bit line, the plate line, and the select gate line, the plate line and the select gate line being common to the first and second memory cells.

13. The memory device including a semiconductor element according to claim 12, wherein the first and second shield gate conductor layers are connected to first and second shield lines, and a ground voltage is applied to the first and second shield lines in the data write operation, the data write prohibition operation, and the data read operation.

14. The memory device including a semiconductor element according to claim 13, wherein the ground voltage is zero volt.

15. A memory device including a semiconductor element, wherein the plurality of semiconductor memory cells according to claim 1 are arranged in a matrix on a substrate to form memory blocks, and a plurality of the memory blocks are selected during at least one of the data write operation, the data erase operation, and the data read operation.

* * * * *